US010483055B2

(12) United States Patent
Aromin et al.

(10) Patent No.: US 10,483,055 B2
(45) Date of Patent: Nov. 19, 2019

(54) PROGRAMMABLE ARC FAULT CIRCUIT INTERRUPTER (AFCI)

(71) Applicants: Victor V. Aromin, West Warwick, RI (US); David Durfee, Scituate, RI (US); Petar Horvatic, Providence, RI (US); Steven O'Connell, East Greenwich, RI (US)

(72) Inventors: Victor V. Aromin, West Warwick, RI (US); David Durfee, Scituate, RI (US); Petar Horvatic, Providence, RI (US); Steven O'Connell, East Greenwich, RI (US)

(73) Assignee: Tower Manufacturing Corp., Providence, RI (US)

( * ) Notice: Subject to any disclaimer, the term of this patent is extended or adjusted under 35 U.S.C. 154(b) by 224 days.

(21) Appl. No.: 15/643,293

(22) Filed: Jul. 6, 2017

(65) Prior Publication Data

US 2018/0151311 A1     May 31, 2018

Related U.S. Application Data

(63) Continuation-in-part of application No. 15/361,391, filed on Nov. 26, 2016, now abandoned.

(51) Int. Cl.
  *H02H 7/00*   (2006.01)
  *H01H 9/50*   (2006.01)
  *H01H 9/54*   (2006.01)
  *G01R 31/02*  (2006.01)
  *H02H 1/00*   (2006.01)
  *G01R 31/14*  (2006.01)
  *G01R 19/25*  (2006.01)
  *H01H 83/20*  (2006.01)

(52) U.S. Cl.
  CPC .............. *H01H 9/50* (2013.01); *G01R 31/02* (2013.01); *G01R 31/14* (2013.01); *H01H 9/54* (2013.01); *H02H 1/0015* (2013.01); *G01R 19/2509* (2013.01); *G01R 19/2513* (2013.01); *H01H 2083/201* (2013.01)

(58) Field of Classification Search
  None
  See application file for complete search history.

(56) References Cited

U.S. PATENT DOCUMENTS 5,121,282 A * 6/1992 White .............. G01R 31/1263
                                                361/111

* cited by examiner

*Primary Examiner* — Stephen W Jackson

(57) ABSTRACT

A programmable arc fault circuit interrupter (AFCI) is provided. The programmable AFCI includes a dual resistive shunt array for developing inputs to an analog front end which in turn develops trigger quantities for input to a programmable processor. The programmable processor determines if the trigger quantities, singularly, or in the aggregate, exceed predetermined thresholds. Determining the predetermined thresholds are exceeded the processor issues a trigger command to momentarily energize a delatching coil, thus removing AC mains power from a load.

19 Claims, 7 Drawing Sheets

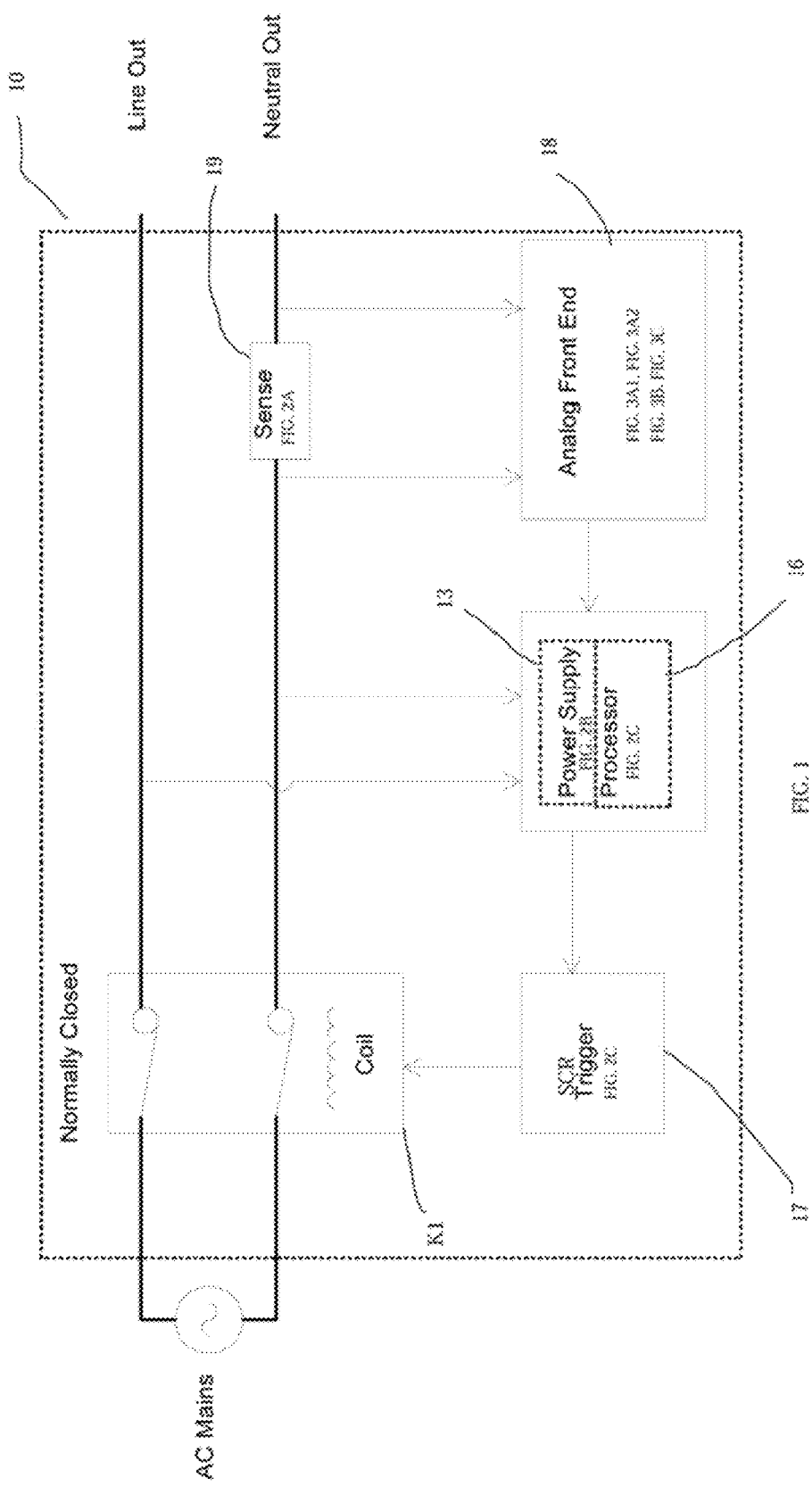

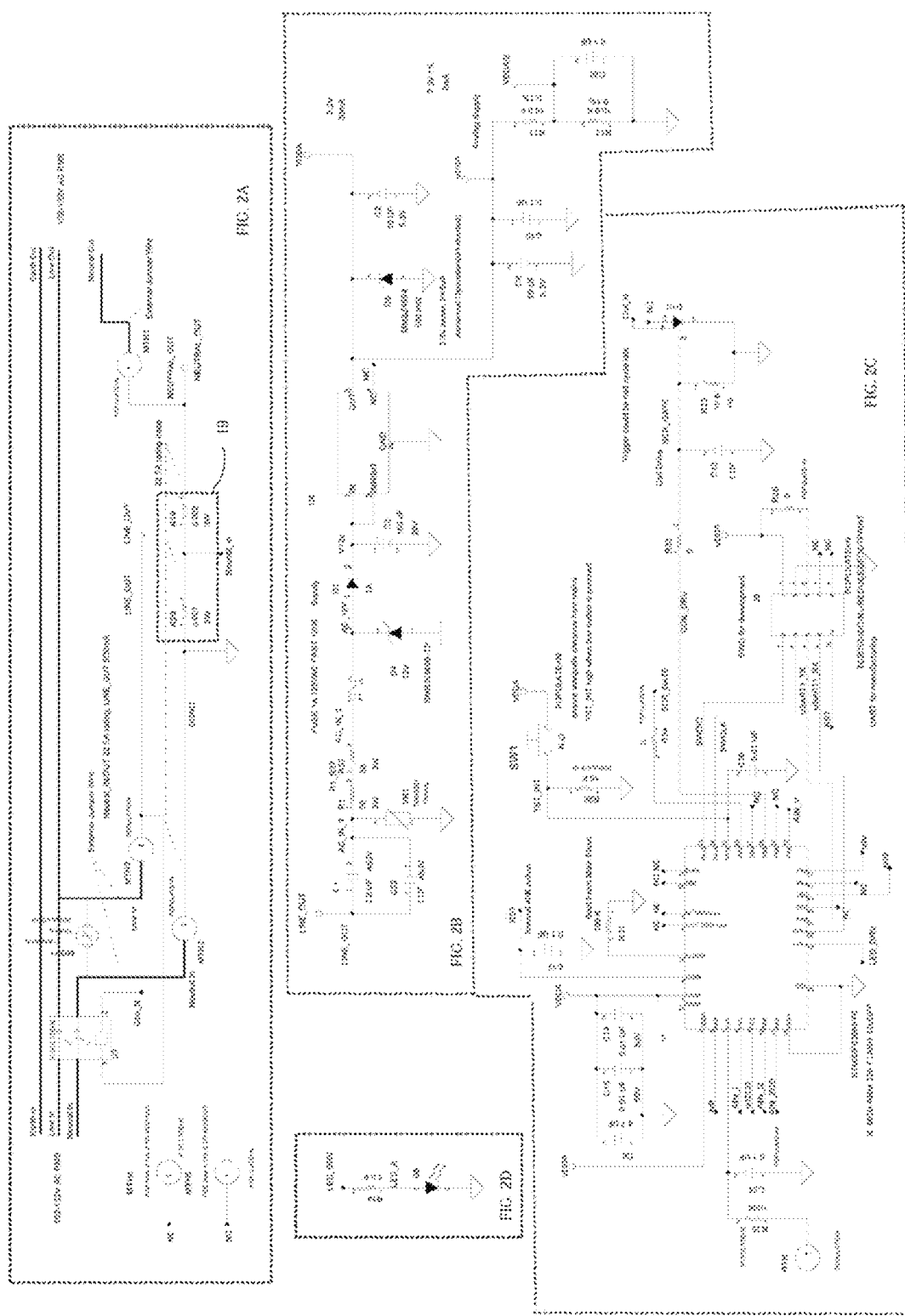

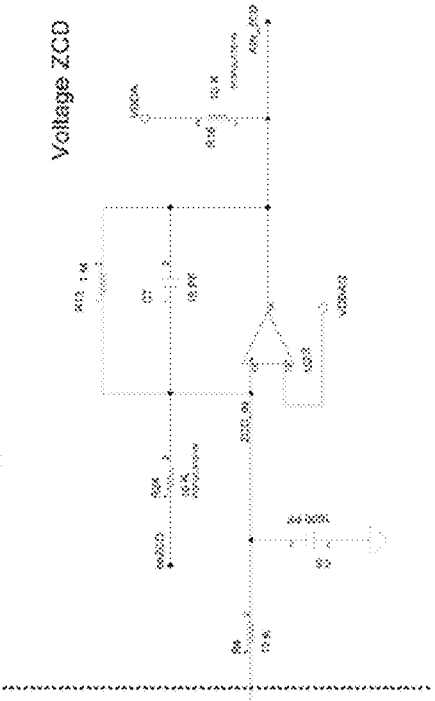
FIG. 3A2 — Voltage ZCO
FIG. 3A1 — Voltage Sense
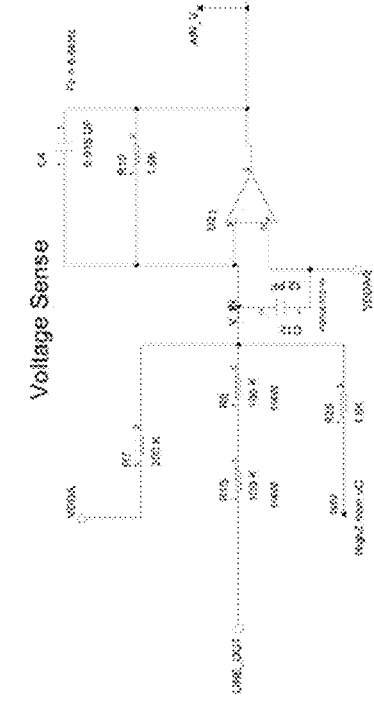
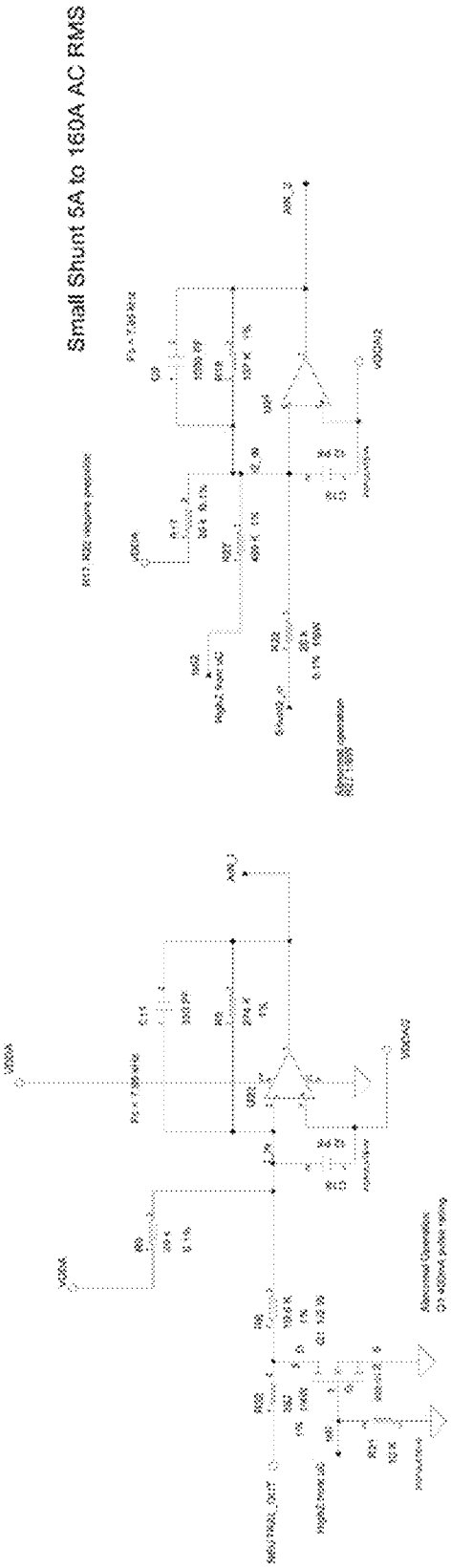
FIG. 3C — Small Shunt 5A to 160A AC RMS
FIG. 3B — Main Shunt 400mA to 22.5A AC RMS

PROGRAMMABLE ARC FAULT CIRCUIT INTERRUPTER (AFCI)

CROSS-REFERENCE TO RELATED APPLICATIONS

The present application is related to, claims the earliest available effective filing date(s) from (e.g., claims earliest available priority dates for other than provisional patent applications; claims benefits under 35 USC § 119(e) for provisional patent applications), and incorporates by reference in its entirety all subject matter of the following listed application(s) (the "Related Applications") to the extent such subject matter is not inconsistent herewith; the present application also claims the earliest available effective filing date(s) from, and also incorporates by reference in its entirety all subject matter of any and all parent, grandparent, great-grandparent, etc. applications of the Related Application(s) to the extent such subject matter is not inconsistent herewith:

This application is a continuation-in-part of U.S. patent application Ser. No. 15/361,391 entitled "Programmable Arc Fault Circuit Interrupter", naming Victor V. Aromin as inventor, filed 26 Nov. 2016.

BACKGROUND

1. Field of Use

The invention pertains to the field of arc fault detectors and interrupters, and in particular, to a programmable arc fault interrupter which detects and interrupts line side power upon detection of arcing.

2. Description of Prior Art (Background)

A percentage of fires each year are caused by electrical branch circuit wiring arcing faults involving currents below the trip level of a conventional circuit breaker or OCPD (over current protection device) as well as below the handling rate of the breaker. Basic overcurrent protection afforded by circuit breakers is designed to prevent $I^2R$ heating of the wiring in the electrical distribution system, caused by circuit overloading or line-to-line faults. AFCI (Arc Fault Circuit Interrupter) technology affords protection from conditions that may not necessarily be an immediate threat but could become hazardous if left unattended.

Arcing is defined as a luminous discharge of electricity across an insulating medium. The electrical discharge of an arc can reach temperatures of several thousand degrees Celsius. Arcing produces sufficient energy to reach the ignition point of nearby combustible material(s) before a circuit breaker can respond. Arc detection is an enhancement to thermal magnetic overload detection typically used in circuit breakers which alone may not detect and respond to arc faults.

A number of devices for detecting arc faults and methods of detection have been used in the past. These include using E and B field arc sensors, detecting the amplitude of the rate of change of current signals when an arc fault occurs, using non-overlapping band pass filters to detect white noise characteristic of arcs, and utilizing the high frequency components (RF) of arcing waveforms to detect arcing faults. While some of these techniques are more or less effective than others, they require relatively sophisticated arc sensors and circuits. Heretofore, most arc detection circuits have been incorporated in circuit breakers.

"A-type" arc faults are those in which the arc occurs across a break in the line or neutral conductors or at a loose terminal in a branch circuit of a distribution network. The conductors are carrying current to a load derived from the line voltage. The arc could likewise occur as a break or at a loose terminal associated with an extension cord deriving power from line voltage, thereby completing the circuit to the load.

"B-type" arc faults are a second arcing condition that must be detected and interrupted by a combination outlet device. In a B-type fault, the arc occurs across two conductors in the branch circuit or extension cords plugged into it, at a site where the insulating media separating the two conductors has been compromised. The arc may occur across the line and neutral conductors or the line and ground conductors, or in the case of reverse polarity where the line voltage is reverse-polarized, between the neutral and ground conductors. The current through the B-type fault is not limited by the impedance of the load, but rather by the available current from the supply established by the impedance of the conductors and terminals between the source of line voltage and the position of the parallel fault, i.e., the conductive members carrying the fault current. Since B-type faults are effectively across the line, they are also known as "parallel faults."

Due to the nature of AC-Mains powered devices and appliances that are to be protected using AFCI, the types of current and voltage waveforms introduced by new appliances for which AFCI is required to operate requires differing discriminating margins to avoid false AFCI tripping. This requirement is especially true for new Energy Star appliances which are known to control current in various unusual ways in order to save energy. This introduces complications for majority of AFCI devices that merely pass UL1699. UL1699 specifically states that older appliances are to be used for testing. This creates a scenario where UL approved AFCI plugs are often returned due to nuisance tripping.

Thus, there is a requirement for a low cost, low form factor programmable AFCI adjustable to discriminate between true arc faults and transients across a wide range of applications.

Arc faults posing fire risk can are characterized herein as parallel or series arc faults. A high current and a voltage drop that is similar to shorting line and neutral together in a parallel fashion is referred to as parallel arcing. Lower current and lower voltage drop arcing conditions are referred to as series arcing. The invention described herein is directed towards an apparatus and method for detecting parallel or series arcing conditions.

BRIEF SUMMARY

According to an embodiment of the invention, an arc fault circuit interrupter operatively connected between a line side and a load side of an AC electric power distribution system includes tripping means for interrupting power to the load.

In accordance with one embodiment of the invention a programmable Arc Fault Circuit interrupter (PAFCI) for disengaging alternating current (AC) power from a load is provided. The PAFCI includes a relay switch disposed between the AC power and the load; a trigger circuit for actuating the relay switch; and a plurality of sensing devices disposed between the AC power and the load. The invention also includes at least one sensing circuit connectable to the plurality of sensing devices, wherein the sensing circuit determines at least one circuit parameter; and a processor circuit connectable to the trigger circuit, wherein the processor circuit determines from the at least one circuit parameter if an arcing condition exists. The PAFCI does not include toroidal devices for sensing arcing conditions.

The invention is also directed towards a programmable Arc Fault Circuit Interrupter (PAFCI) for classifying arcing parameters according to a connected load and detecting parallel or series arcing in accordance with the arcing parameters. The PAFCI includes a sensing circuit and a processor circuit connectable to the sensing circuit. The processor circuit includes a microcontroller having a non-transitory program storage medium which tangibly embodies: a first program of instructions executable by the microcontroller to classify the arcing parameters according to the connected load; a second program of instructions executable by the microcontroller to determine a parallel arcing condition; and a third program of instructions executable by the microcontroller to determine a series arcing condition. The PAFCI does not include toroidal devices for sensing series or parallel arcing conditions.

The invention is also directed towards a method for detecting arc faults based upon connected load dependent arcing threshold parameters. The method includes classifying the dependent arcing threshold parameters according to the connected load and determining if an arcing condition exists based upon the dependent arcing threshold parameters.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

FIG. 1 is a block diagram an embodiment of the present invention;

FIG. 2A is schematic diagram of the AC Mains/Line Out/Neutral Out shown in FIG. 1;

FIG. 2B is a schematic diagram of the VDD Power Supplies shown in FIG. 1;

FIG. 2C is a schematic diagram of the AFCI processor shown in FIG. 1;

FIG. 2D is a schematic diagram of a LED connectable to the circuit shown in FIG. 2C;

FIG. 3A1 is a schematic diagram of the Voltage ZCD hysteresis circuit connectable to the circuit shown in FIG. 2C;

FIG. 3A2 is a schematic diagram of the AIN_ACD trigger circuit connectable to the circuit shown in FIG. 2C;

FIG. 3B is a schematic diagram of the AIN_I trigger circuit connectable to the circuit shown in FIG. 2C;

FIG. 3C is a schematic diagram of the AIN_I2 trigger circuit connectable to the circuit shown in FIG. 2C;

DETAILED DESCRIPTION

Figure 4:
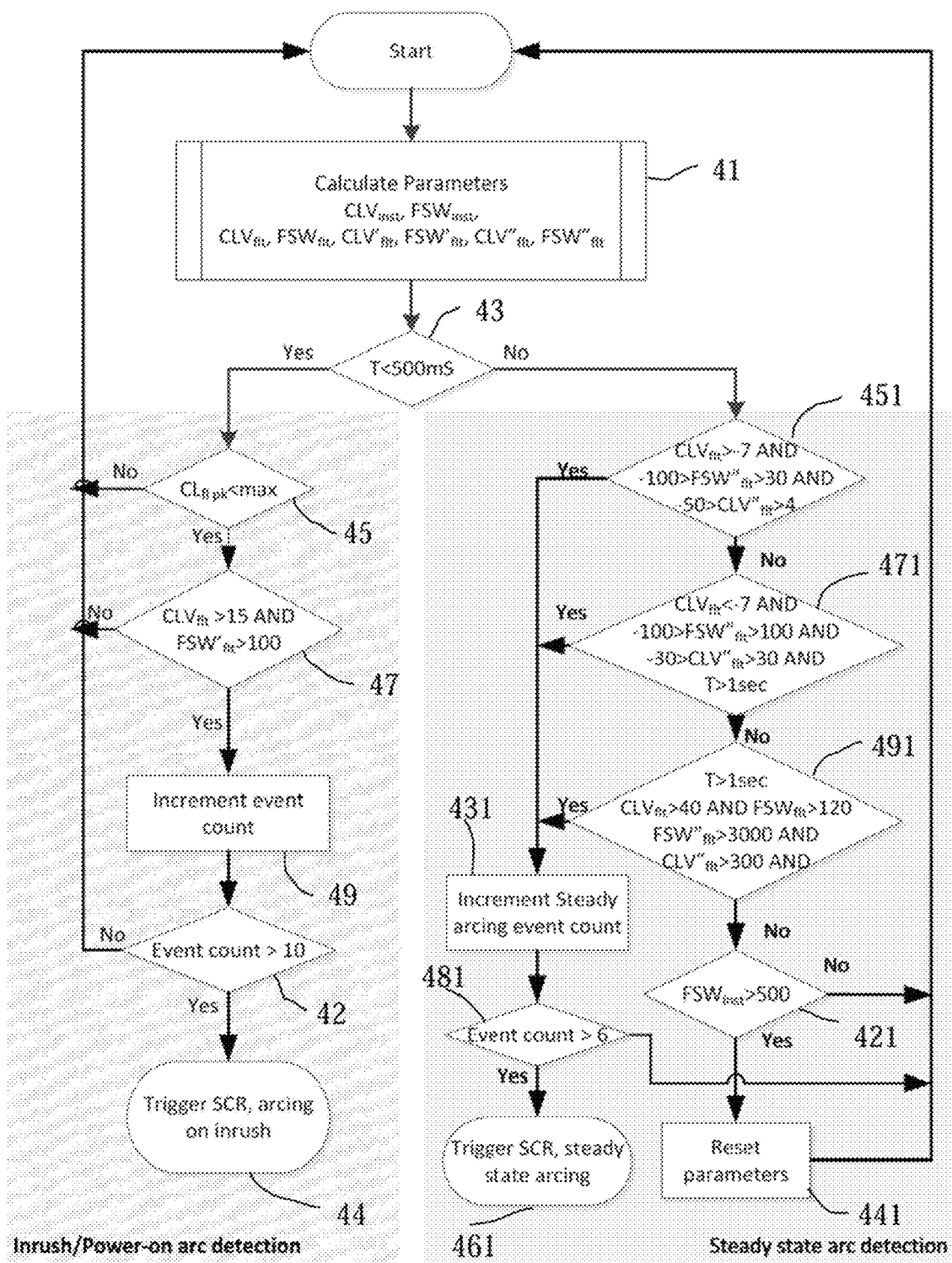
FIG. 4 is a method flow chart of one method for implementing features of the present invention shown in FIGS. 1-3C.

The following brief definition of terms shall apply throughout the application:

The term "comprising" means including but not limited to, and should be interpreted in the manner it is typically used in the patent context;

The phrases "in one embodiment," "according to one embodiment," and the like generally mean that the particular feature, structure, or characteristic following the phrase may be included in at least one embodiment of the present invention, and may be included in more than one embodiment of the present invention (importantly, such phrases do not necessarily refer to the same embodiment);

If the specification describes something as "exemplary" or an "example," it should be understood that refers to a non-exclusive example; and If the specification states a component or feature "may," "can," "could," "should," "preferably," "possibly," "typically," "optionally," "for example," or "might" (or other such language) be included or have a characteristic, that particular component or feature is not required to be included or to have the characteristic.

Referring now to FIG. 1 there is shown a block diagram of one embodiment of the present programmable AFCI invention 10. Shown in FIG. 1 are the following subcomponents: processor (uC) 16, power supply 13, sensing device 19, analog front end 18, trigger coil circuit 17, and coil switch K1.

AFCI 10 is designed to disconnect AC mains via coil switch K1 if hazardous arcing conditions are detected, such as those conditions as defined in Underwriter Laboratories 1699 (UL1699). Analog front end 18 senses current drawn by a load as well as mains voltage. Sense is provided via sensing device 19 (discussed herein). Analog front end 18 provides processor 16 with derived operational trigger quantities inputted into arc detection method non-transitory programming code encoded in firmware (FW) hosted in microcontroller, U1 (discussed herein). Microcontroller U1 may be any suitable microcontroller, such as, for example, STM32F030x4/x6/x8/xC microcontrollers from CORTEX. Based on the FW method, processor 16 sends a signal to the trigger mechanism 1 when hazardous conditions occurs. Relay coil 12 used for disconnecting AC Mains is triggered by solid state device that will momentarily energize the relay; causing AC mains to be disconnected. The solid state device may be, for example, any suitable solid state device such as at least one silicon controlled rectifier (SCR) or at least one transistor.

Referring also to FIG. 2A there is shown a schematic diagram of the AC Mains/Line Out/Neutral Out shown in FIG. 1. It will be appreciated that an inexpensive means of measuring current is via shunt resistors R19, R20. However, a limited amount of power can be dissipated using shunt resistors. As such, a detailed analysis was conducted to ensure various over-current tests specified by UL1699 can be handled by the FW method when using shunt resistors R19, R20. Analysis included use of processor U1 (see FIG. 2C) to disrupt supply prior to shunts R19, R20 overheating. Each shunt can dissipate more power for overload test conditions; and, specific subsection of UL1699 requires the plug to not become hazardous when any single passive component is open/short-circuited. On designs employing single current sense mechanism, short-circuiting the sense mechanism results in inability of the device to detect potentially hazardous current flow. With the choice of two shunts, the FW method is able to employ runtime diagnostics on each sense resistor, thus diagnosing single open/short-circuit condition at runtime and disabling power to the load.

Still referring to FIG. 2A. In order to pass surge and transients a metal oxide varistor (MOV) is specified on the load side of Coil relay shown in FIG. 1. A suitable MOV is Thinking TVR14391-D. A suitable alternate would be Thinking TVR14391 of Vishay VDRS14250. It will be appreciated that while only one MOV is shown in FIG. 1, any suitable number of MOVs may be used.

Referring also to FIG. 2C it will be appreciated that to capture features required to detect arc faults, voltage and current waveforms need to be captured at 32 kHz sample rate. At that rate 16 MHz PIC processors and their inadequate handling of interrupts and lack of timers are not suitable to implement the AFCI method discussed herein.

Referring also to FIG. 2B there is shown a schematic diagram of the VDD Power Supplies shown in FIG. 1. Due to cost constraints power supply is a filtered capacitive type with minimal components.

Still referring to FIG. 2B, input cap C1 was too small to allow adequate current from AC mains. Larger than 2.2 uF 250V C1 was hard to find in surface mount package and reasonable price. Instead, a second 1 uF 250V cap was added to raise capacitance to 3.2 uF. Because of the increase in current, R1 had to be lowered to 47 ohms to allow for power de-rating.

F1 is a chip fuse used to protect the circuit during abnormal operations tests, e.g., when C1 or C22 is shorted. It will be appreciated that the 56 ohm resistors fail open and act as a fuse. Fuse F1 is a backup circuit protection in case both resistors R1, R37 fail to open when C1 or C22 are shorted.

D4, 12V Zener is regulates on negative half cycle.

D1 is chosen to prevent C3, from discharging back into C1 during negative half cycle.

C8, C10, C2 are filtering caps on VddA, without either one, plug will be more likely to nuisance trip.

U4 is a suitable 50 mA 3.3V Low Drop Out (LDO) regulator used to regulate voltage to 1%. With input voltage requirement for the LDO being 4-16V, D4 input Zener is lowered to 12V 5 W. In order to satisfy processor supply requirement requiring Vdd, VddA in the range 2.5V to 3.6V, capacitor C3 is added to the input of LDO.

D5 is a 3.3V 500 mW Zener on Vdd side. This is for abnormal operations, in case U4 is shorted, resulting in large voltage at VddA and Vdd. The D5 Zener protects processor U1 from seeing voltage levels beyond absolute maximum ratings.

Referring also to FIG. 3A2 there is shown a Voltage sense circuit in accordance with the present invention. Voltage sense input is biased around ½ of 3.3V(VddA) so that both positive and negative voltage with respect to neutral can be measured.

The following describe the circuit parameters:

$$Vin^-=VddA/2, R7=R8+R15$$

$$(Vin^--AIN\_V)/R10=(VddA-Vin^-)/R7+(VLine-Vin^-)/(R8+R15)$$

$$½VddA-AIN\_V=\cancel{VddA(R10/R7)-½VddA(R10/R7)}+VLine(R10/(R8+R15))-½VddA(R10/(R8+R15))$$

$$½VddA-AIN\_V=½VddA(R10/R7)+VLine(R10/(R8+R15))-½VddA(R10/(R8+R15))$$

$$AIN\_V=½VddA-VLine(R10/(R8+R15))+½VddA(R10/(R8+R15))-½VddA(R10/R7)$$

$$AIN\_V=½VddA-VLine(R10/(R8+R15))+½VddA*R10*(1/(R8+R15)-1/R7)$$

$$AIN\_V=½VddA-VLine(R10/(R8+R15))+½VddA*R10*(R7-(R8+R15))/(R8+R15)/R7$$

Where AIN_I is an analog-to-digital converter (ADC) input from the main shunt shown in FIG. 3B, AIN_I2 is an ADC input from the small shunt shown in FIG. 3C.

If R7 is not equal to R8+R15, the AIN_V equation becomes:

$$AIN\_V=½VddA-VLine(R10/(R8+R15))+½VddA\ R10*(R7-R8-R5)/R7/(R8+R15)$$

This equation consists of mid point term, ½ VddA; AC oscillating term that is a fraction of AC line voltage, VLine (R10/(R8+R15)); and a small term that is a result of having tolerance offset. ½ VddA R10*(R7−R8−R15)/R7/(R8+R15)

Worst case offset is about 13 mV at ADC input. Voltage resolution is 186V peak in both directions. 3.3V/186/2=8 mV/V It will be understood that the method described herein interprets, for example, zero crossing regions any time Line Voltage is +/−1.5V away from actually zero crossing. If sampled at 32 kHz, each sample is about 2V apart, resulting in an offset by about 1 sample.

If R7=R8+R15, the third term goes to zero.

$$AIN\_V=½VddA-VLine(R10/(R8+R15))$$

C4 along with R10 is chosen to provide op-amp low-pass cut-off of 8 Khz or ¼ of sample rate (32 khz). C4 cap provides means of filtering noise in the AC mains line at a cost of about 1-2 samples of time delay. ¼ of the sampling rate is a reasonable tradeoff in filtering while preserving majority of 32 khz sampled signal. It will be appreciated that smaller capacitor values increase cut off and pass more noise into the circuitry.

Simulation shows that 3.1V is the ADC sense voltage peak when AC supply is at 132V AC RMS. This translates into 1800 count over the mid-point (2048). After the detailed tolerance analysis was performed, a safe margin was determined to be a count of 1875 as the max value for voltage reading. Anything over that is considered railed and used as an indicator of fault.

It will be appreciated that the invention can operate at a minimum of 102V AC RMS. In addition, voltage dips requirements as well as parallel arc behavior all influence analog input level below which method considers voltage sense as a fault. If voltage peak during a half cycle exceeds a predetermined count, e.g., 950, the method will consider it as a potential fault or arcing event.

Referring also to FIG. 3B and FIG. 3C, there is shown a Main Shunt circuit, and a Small Shunt circuit, respectively, in accordance with the present invention shown in FIG. 1. It will be understood and appreciated that the Main Shunt and Small Shunt circuits, operating in conjunction are able to detect a condition where a shunt is shorted due to abnormal operation. A single shunt circuit cannot detect a condition where a shunt is shorted due to abnormal operation. The two sensing circuits are used to provide the processor U1 necessary quantities in order to determine the presence of arcing or other fault conditions.

Still referring to FIG. 3B, the Main Shunt circuit measures current in the operating range of potentially hazardous arcing. It will be understood and appreciated that the method detects current flat spot regions accurately (i.e., a flat spot of a current waveform) thus a minimum detectable current is 840 mA peak. Furthermore, the invention detects arcing for up to 150% of the rated current which is 22.5 A RMS or 32 AC peak.

Main Shunt circuit shown in FIG. 3B employs means of calibrating the AIN_I DC level, determined to be critical for accurate arc fault detection. The signal equations for Main Shunt circuit is:

Op-amps are biased at ½ of Vdda or 1.65V nominal.

Currents to Vin⁻ of the AIN_I opamp sum up as following:

$$(Vin-AIN\_I)/R5=(Vdda-Vin-)/R9+(Vshunt-Vin-)/R6$$

Letting $Vin^- = Vdda/2$, and $R6+R32=R9$ $$Vdda/2R5-AIN\_I/R5=Vdda/2R6-Vdda/2R6+Vshunt/R6$$

$$Vcca/2R5-Vshunt/R6=AIN\_I/R5$$

$$AIN\_I=Vcc/2-Vshunt(R5/R6)$$

Still referring to FIG. 3B and FIG. 3C, R20 (see FIG. 2A—Shunt2_in) is chosen at 0.001 ohms and R19 (see FIG. 2A) at 0.002 ohms giving total shunt value of 0.003 ohms. R6 is ½ W due to abnormal conditions if R20 is removed Cutoff for LPF is 7.95 kHz.

AIN_I channel can detect arcing at minimal current (5 A RMS). Flat spot (12% of current peak) is detectable and above noise floor).

AIN_I2 channel has detectable voltage level (above noise threshold) at 5 A RMS so that the method described herein determines that current flows through small shunt.

AIN_I channel is not railed at maximum load current (150% of 15 A RMS).

AIN_I2 channel is not railed at maximum peak inrush current for which plug is required to not trip, per UL1699. (150 A peak).

During functional testing it was discovered that 1% tolerance of the 20K resistors R9 and R6 along with input offset voltage of the op-amp were causing the no-current mid point reading to stray away from theoretically calculated VDDA/2. Variance showed this to be an issue for accurate detection of Flat spot width and current leads voltage conditions. U1's tstI is used to drive the gate of N-FET, Q1 to allow U1 to create a test condition for which known DC level on the AIN_I channel is created. This allows U1 to calibrate AIN_I thus eliminating resistor tolerances, op-amp tolerance and temperature drifts.

It was determined that certain devices, such as, for example, vacuum cleaners are prone to rail the large shunt for up to 170-190 mS. The Method is configured to look at 24 samples of railed large shunt. Large shunt peaks (maximums of each half cycle) are filtered and sampled every 10 mS. Thus, for example, 24 samples of railed large shunt will happen in 240 mS. By about 250 mS, the invention will energize the K1 relay coil, interrupting the connection between AC mains and line/neutral out (see FIG. 1). It will be appreciated that the number of samples, e.g., 24 can be adjusted to sense an arc fault sooner or to decrease nuisance tripping with inrush conditions.

Referring also to FIG. 3C there is shown a circuit schematic of the Small Shunt circuit: AIN_I2=Vcc/2+Vsmall_shunt (R18/R22), The Small Shunt circuit detects current peaks of up to 200 A. For 200 A peak=Vsmall_shunt=200 A*0.001 ohm=0.2V The ADC input signal nominally needs to be below 3V rail. Thus 3V−1.65V=1.35V. The DC gain of small shunt opamp U24 is 1.35V/0.2V=6.75, this yields R18=135 k Ohms, closest commercially available value is 137 k Ohms.

For a low current, conditioning circuit needs to ensure that for R18=137 k, 5 A AC RMS current or 7 A peak can be detected by the shunt and is not hidden in the noise. This prevents self-diagnostics from accidentally declaring the small shunt shorted.

Voltage level at ADC is: ADC_I2=1.65V+7 A*0.001*6.85=1.697V or 47 mV peak above mid-range. This is a reasonable value for a 12 bit ADC.

Referring also to FIG. 3A2, there is shown a Voltage zero cross detection (ZCD) circuit. Sensitive internal circuitry of U1 does not allow for measuring voltage zero crossing directly from the Line via high value resistors. Additional protection for the U1 processor is required when line voltage is measured. Instead of simple resistor protection, ZCD will use an input from $V_{out}$ and op-amp U23 will be used for hysteresis.

Output of Voltage sense (see FIG. 3A1) is fed into Voltage ZCD hysteresis circuit (see FIG. 3A2). Hysteresis circuit includes capacitive coupled positive feedback, C7. Capacitor C5 eliminates the spike on Vout when comparator U21 fires. R16 is a pull up resistor. Capacitor values as shown provide a 1 sample delay, ⅓₂kHZ or 0.03 mS. Lowering C7 lowers the delay but compromises hysteresis. Due to positive feedback 1 Meg is placed in parallel with C7 to limit effects of positive feedback at various frequencies.

Arc faults posing fire risk can often be characterized as parallel or series arc faults. The present method detects either type fault using sampled current and line voltage and determining if an arcing condition exists. It will be appreciated that the present invention does not use magnetics such as toroidal inductors or transformers to sense arc fault conditions.

The presence of a parallel arc is manifested in high current where both small (5 A-150 A) and large (0.1 A-32 A) shunts are railed. In addition, at the time of high current flow, line voltage is significantly reduced. If 6 half cycles (6×8 ms) of arcing conditions are detected parallel arc is declared. In general, a 10 ms interval provides a suitable sample time.

Parallel arcing is declared if the small shunt magnitude is greater than a threshold value a predetermined number of sample times, or if the magnitude is less than a threshold value and the large shunt is present (see FIG. 3B); if the large shunt peak magnitude is greater than a threshold value a predetermined number of sample times, or if the magnitude is less than a threshold value and the small shunt (see FIG. 3C) is present; if the voltage peak magnitude is greater than or less than predetermined thresholds; or if the voltage zero crossing peak (see FIG. 3A2) is less than a predetermined threshold value. It will be understood that the predetermined sample times and predetermined thresholds are user selectable and may depend on externally connected devices, e.g., humidifiers, air conditioners, refrigerators and the like.

For detecting series arcing, the current midpoint is determined by the microcontroller U1 (see FIG. 2C) from a long-term average FW digital filter (AFCI_CURRENT_MIDPOINT_FILTER), and then processed with the current from the main or small shunt ADCs (see FIGS. 3B and 3C) to yield a value used for determining a series arc condition. The current is then FW averaged (AFCI_ProcessAverage) and then FW peak detected (AFCI_ProcessAveragePeak).

The time stamp of current zero crossing is FW determined (AFCI_ProcessZeroCrossing). Zero crossing threshold is dynamically calculated based on a fraction of previous half cycle current peak as described here $CL_{inst}$=Instantaneous current. Analog reading for voltage across the shunt in units of ADC counts [0 to 2048].

$CL_{fl\ pk}$=Filtered instantaneous current peaks in units of ADC counts [0 to 2048]. Each half cycle has a maximum instantaneous sample referred to as instantaneous peak. This quantity is filtered to get $CL_{fl\ pk}$. Low pass filter cutoff is determined empirically.

Current Large (CL) is current measured by large shunt, a combination of 1 mohm and 2 mohm shunts. Voltage Zero Crossing The voltage zero crossing is determined (AFCI_ProcessZeroCrossing) based on input from the ZCD shown in FIG. 3A2.

5.1.2.3 Detecting

The method described herein includes several quantities used in the featured arc fault detection:
a. Current Leads voltage (CLV) Variance and Derivative of CLV variance,
b. Flat Spot Width (FSW) Variance and Derivative of FSW variance.
c. Use of variance and derivative of variance for Current lead voltage (CLV).

Current leads voltage (CLV) is a quantity suggesting that when sinusoidal load arcing occurs, current will go to zero prior to voltage reaching zero. This property is distinct from non-arcing sinusoidal load where current and voltage are zero aligned, or small inductive loads where current zero-crossing (ZCI) is known to lag voltage zero crossing (ZCV). ZCV is a single time sample or range of consecutive time samples where AC mains voltage is 0 CLV and is expressed in terms of samples in time. ZCI is an instance in time where AC mains current is crossing 0.

To reduce nuisance tripping the present method introduces two additional quantities, Variance of CLV and derivative of Variance of CLV. Variance of CLV indicates how much CLV varies, and Derivative of CLV variance indicates if variance is increasing or decreasing and how fast. The variables are defined as follows:

$CLV_{inst}$=Instantaneous Current leads voltage in units of samples. Number of samples where current enters flat spot region before VZC. Flat spot region is section of a current waveform where $CL_{inst}$<12% of $CL_{fl\ pk}$. Because of the predetermined 12% threshold (or any suitable predetermined threshold), it is anticipated to have several samples of current lead for purely resistive load where current and voltage are known to be time aligned.

$CLV_{flt}$=Low Pass Filtered $CLV_{inst}$ in units of samples. Because of temporal alignment noise present in AC mains, $CLV_{inst}$ is averaged over multiple half cycles.

$CLV'_{inst}$=Instantaneous CLV Variance $CLV'_{inst}$=($CLV_{inst}$−$CLV_{flt}$)2

$CLV'_{flt}$=Low Pass Filtered CLV Variance $CLV''_{inst}$=Instantaneous Derivative of CLV var. $CLV''_{inst}$=$CLV'_{inst}$−$CLV'_{flt}$. Because sample rate is constant, the dt part of derivative is ignored and accounted for by adjusting threshold values.

$CLV''_{flt}$=Filtered Derivative of CLV variance

FSW is determined as the current being less than a threshold (12% of the current peak) in sample counts. In arcing waveforms, the FSW becomes elongated and random. However, this can happen in many non-arcing waveforms as well. To reduce nuisance tripping the present method introduces two additional quantities, variance of FSW and derivative of Variance of FSW. These are used to accurately discriminate arcing and non-arcing behavior for various loads.

The FSW is processed for variance: average, variance, and variance first derivative. The average is a low pass filter. The variance is the square of the instantaneous value minus the averaged value. The variance first derivative is the instantaneous variance minus the averaged variance. The variables are defined as follows:

$FSW_{inst}$=Instantaneous Flat Spot Width in units of samples. Number of samples for which $CL_{inst}$<12% of $CL_{flpk}$.

$FSW_{flt}$=Low Pass Filtered FSW in units of samples. Because of noise present in AC mains, FSW is averaged over multiple half cycles.

$FSW'_{inst}$=Instantaneous Variance of FSW. $FSW'_{inst}$=($FSW_{inst}$−$FSW_{flt}$)2

$FSW'_{flt}$=Low Pass Filtered FSW Variance $FSW''_{inst}$=Instantaneous Derivative of FSW variance. $FSW''_{inst}$=$FSW'_{inst}$−$FSW'_{flt}$. Because sample rate is constant, dt part of derivative is ignored and accounted for by adjusting threshold values. This is also done to keep the processor at low cost.

$FSW''_{flt}$=Low Pass Filtered Derivative of FSW Variance.

Entry Arc Detection(Inrush, Power-On Detection)

Entry arc detection is referred to portion of the method that processes arcs on powerup, or immediately upon detection of current. The following critical features are used to determine if hazardous conditions exist on power up or when first current detected is that of an arcing load.

FSW variance filter greater than a threshold

CLV filter in a window

Current has not been railed (maxed) since detection process started

Not pc power supply (flat spot average filter greater than a threshold and current leads voltage greater than a threshold)

Not drill (flat spot average filter greater than a threshold and current leads voltage less than a threshold)

Multiple of these events need to occur in half a second to trigger an arc.

Stable Arc Detection

For detecting an arc, or arcs, that may happen after a non-arcing load, stable arc detection method is used. The method transitions into stable are detection with time of greater than a predetermined time, e.g., 500 msec. The method determines a 'normal' condition where although the variance of flat spot width and current leads voltage is non-zero, the variance derivative will be zero or very small. The non-normal 'arcing' condition is detected as the variance derivatives increasing dramatically indicating that both flat spot width and current leads voltage are randomly increasing.

Derivative of FSW and CLV variance will be random and are likely to vary drastically in arcing situations. Each of the load types, linear resistive, inductive (motor based appliance) or capacitive (Switching mode supply) will have different set of thresholds associated with CLV and FSW parameters. These thresholds are adjusted to give desired detection margin for appliances and loads under various operating scenarios, e.g., inrush non-arcing, steady state non-arcing, inrush arcing or steady state arcing conditions.

Thresholds associated with both variance and derivative of variance for each CLV and FSW are adjusted to give best detection margin for appliances and loads tested under non-arcing inrush, non-arcing steady state and arcing situations.

The combination of thresholds for all quantities are adjusted to give desired discriminating margin for all existent as well as future unknown appliances. Due to the nature of AC-Mains powered devices and appliances that are to be protected using AFCI, the types of current and voltage waveforms introduced by new appliances for which AFCI is required to operate is unknown. However, adjusting the parameters or variables described herein can be used to allow the method described herein to work on new appliances.

This will be especially useful for new Energy Star appliances which are known to control current in various unusual ways in order to save energy. This introduces complications for majority of AFCI devices that merely pass UL1699.

Referring also to FIG. 4 there is shown one method for implementing features of the present invention. Detection, or condition, parameters are calculated 41. If time T is less than 500 ms 43 then several determinations are made. Note that time T can be any suitable threshold. The first determination if T is less than 500 ms, in this example, is if $CL_{fl\,pk}$ is less than a maximum value 45. If it is less than maximum value then a determination if $CLV_{flt}>15$ AND $FSW'_{flt}<100$ is made 47. If this condition exists then event counter 49 is incremented. If the event counter exceeds 10 then U1 (see FIG. 2C) triggers SCR gate signal to disengage power from AC mains to load via relay switch K1 (see FIG. 1).

Still referring to FIG. 4. If time T is greater than, or equal to 500 ms then several conditions are measured. First if $CLV_{flt}>-7$ AND $-100>FSW''_{flt}>30$ AND $-50>CLV''_{flt}>4$ (item 451) is no then the next condition determined is if $CLV_{flt}>-7$ AND $-100>FSW''_{flt}>100$ AND $-30>CLV''_{flt}>30$ AND T>1 sec. (item 471). If no, next condition, item 491 is determined: $CLV_{flt}>40$ AND $FSW_{flt}>120$ AND $FSW''_{flt}>3000$ AND $CLV''_{flt}>3000$ AND T>1 sec. If any of these preceding conditions are met then a steady arcing even count is incremented. When the count reaches a predetermined value, in this example, 6, U1 (see FIG. 2C) triggers SCR gate signal 461 to disengage power from AC mains to load via relay K1 (see FIG. 1). It will be understood and appreciated that the thresholds such as $-7$, $-100$, etc. may be any suitable threshold such as, for example, $CLV_{flt}>SS1$ AND $SS2>FSW''_{flt}>SS3$ AND $SS4>CLV''_{flt}>SS5$, where SS=steady state arcing condition parameter.

Figure 5:
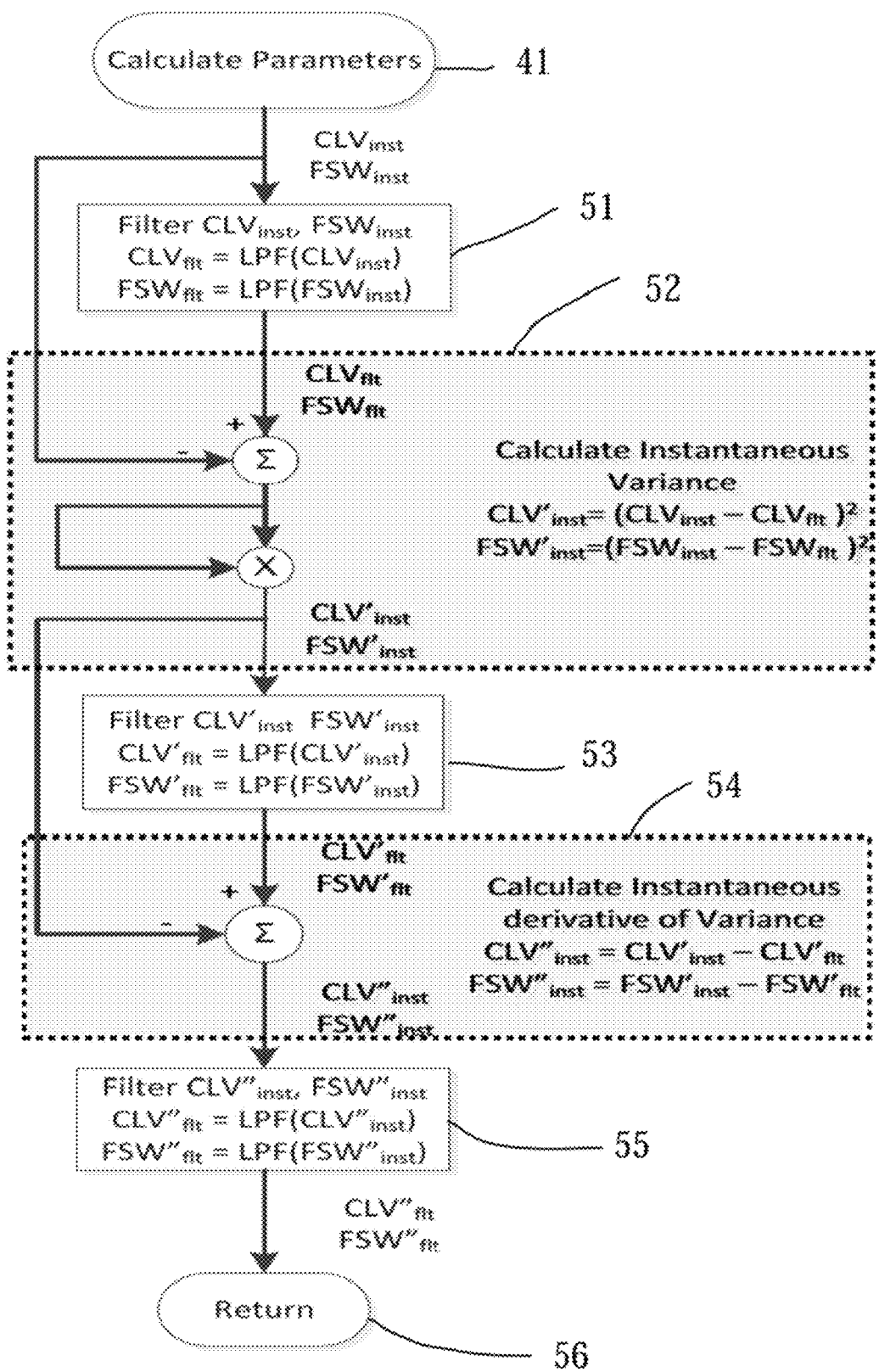
FIG. 5 is a method flow chart of one method for calculating parameters of the present invention shown in FIG. 4.

Referring also to FIG. 5 there is shown one method for determining detection parameters shown in FIG. 4.

The load is classified during startup, and that classification allows the device to determine proper thresholds for detecting a bad arc (vs allowing a good arc). Current Leads Voltage (CLV) in units of samples (260 samples corresponds to half-cycle at 60 Hz and 31.25 kHZ sample rate). Number of ADC samples received from the time when current enters flat spot until the time when voltage zero crossing interrupt is triggered. Variance of CLV (CLV'): The amount by which instantaneous CLV varies from filtered average. Derivative of Variance of CLV (CLV''): Positive CLV'' means CLV variance is increasing and negative means its decreasing.

Figure 6:
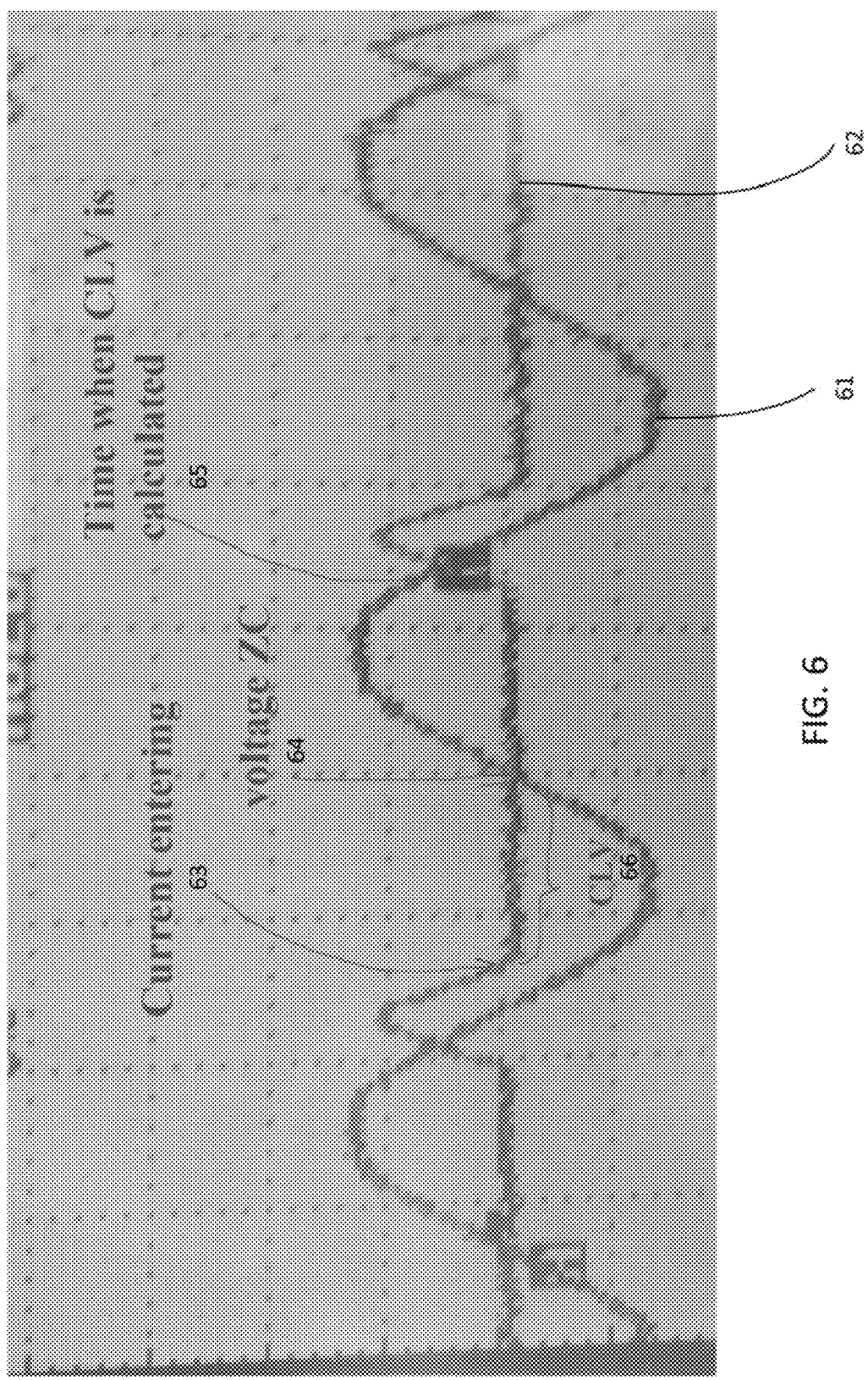
FIG. 6 is an illustration of a voltage waveform superimposed on a half cycle current waveform for calculating parameters of the present invention shown in FIG. 4.

Referring also to FIG. 6 there is shown an illustration of a voltage waveform 61 superimposed on a half cycle current waveform 62 for a small device. CLV 66 is measured from current entering flat spot region 63 to voltage zero crossing 64. Time when CLV is calculated is shown when current leaves flat spot region 65. In order to have small devices produce negative CLV values, consistent with a lagging appliance, the maximum width of a half cycle (for example, 8.33 ms) is added to the "current entering time stamp" if $FSW_{inst}$ is determined to be greater than half cycle. This moves current entering flat spot region 63 time stamp to the other side of the voltage zero crossing.

Figure 7:
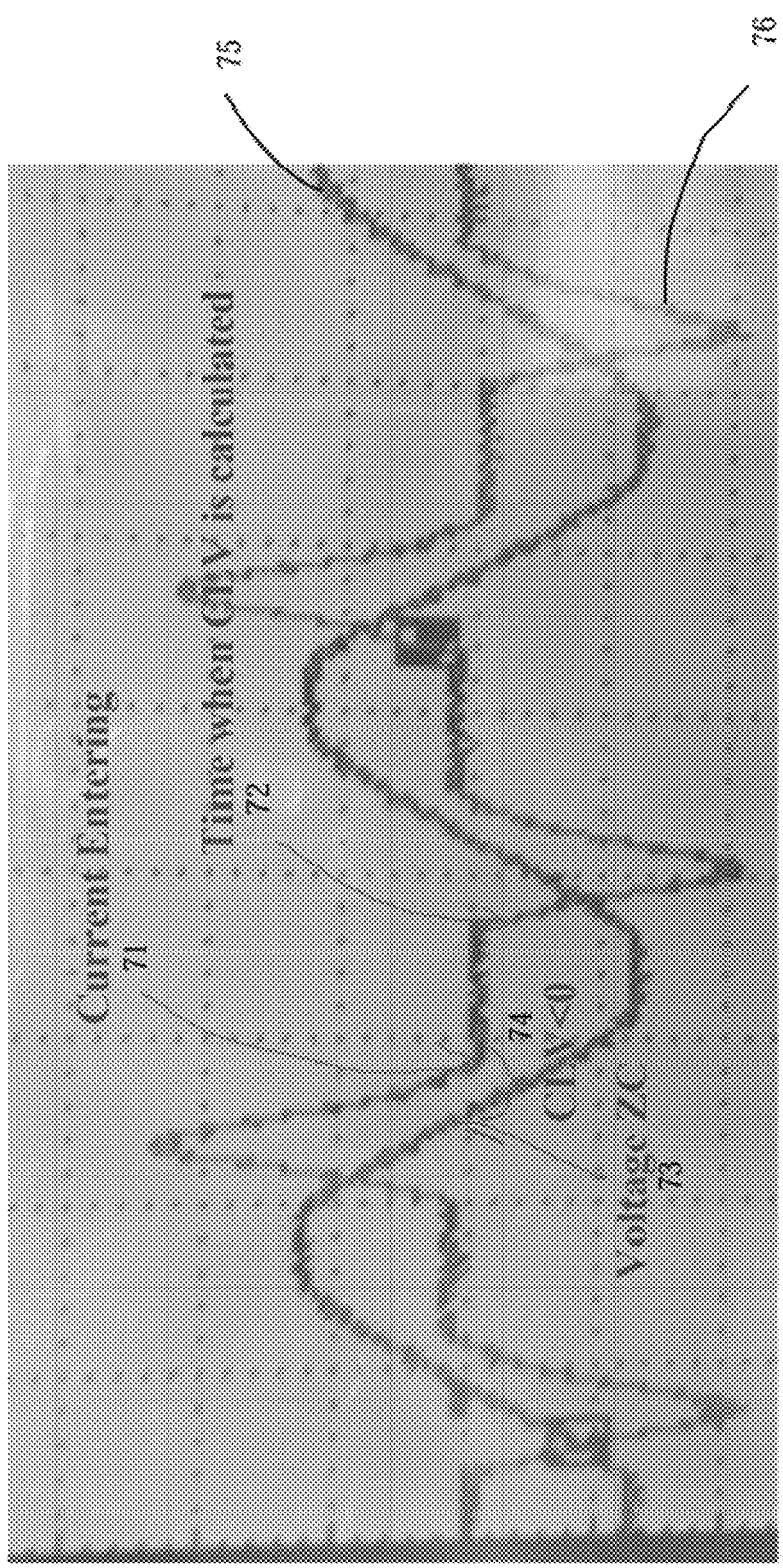
FIG. 7 is an illustration of a voltage waveform superimposed on a full cycle current waveform for calculating parameters of the present invention shown in FIG. 4.

Referring also to FIG. 7 there is shown an illustration of a voltage waveform 75 superimposed on a full cycle current waveform 76 for a large device. CLV 74 is measured from current entering flat spot region 71 to voltage zero crossing 73. Time when CLV is calculated is shown when current leaves flat spot region 72.

It should be understood that the foregoing description is only illustrative of the invention. Thus, various alternatives and modifications can be devised by those skilled in the art without departing from the invention. Accordingly, the present invention is intended to embrace all such alternatives, modifications and variances that fall within the scope of the appended claims.

What is claimed is:

1. A programmable Arc Fault Circuit Interrupter (PAFCI) for disengaging alternating current (AC) power from a load, the PAFCI comprising:
   a relay switch disposed between the AC power and the load;
   a trigger circuit for actuating the relay switch;
   a plurality of sensing devices disposed between the AC power and the load;
   at least one sensing circuit connectable to the plurality of sensing devices, wherein the sensing circuit determines at least one circuit parameter; and
   a processor circuit connectable to the trigger circuit, wherein the processor circuit determines from the at least one circuit parameter if an arcing condition exists; and
   wherein the PAFCI does not include toroidal devices for sensing arcing conditions.

2. The PAFCI as in claim 1 wherein the plurality of sensing devices comprises a plurality of resistors connected in series.

3. The PAFCI as in claim 1 further comprising a power supply circuit connectable to the at least one sensing circuit, wherein the power supply circuit comprises a capacitive power supply.

4. The PAFCI as in claim 3, wherein the capacitive power supply comprises a low drop out (LDO) regulator.

5. The PAFCI as in claim 1 wherein the at least one sensing circuit comprises:
   a voltage sense circuit, wherein the voltage sense circuit determines a first circuit parameter (AIN_V); and
   a voltage zero crossing detection circuit (ZCD), wherein the voltage ZCD determines a second circuit parameter (AIN_ZCD).

6. The PAFCI as in claim 1 wherein the at least one sensing circuit comprises:
   a main current shunt circuit, wherein the main current shunt circuit determines a third circuit parameter (AIN_I); and
   a small current shunt circuit, wherein the small current shunt circuit determines, a fourth circuit parameter (AIN_I2).

7. The PAFCI as in claim 6, wherein the processor circuit comprises microcontroller, wherein the microcontroller comprises a non-transitory program storage medium readable by the microcontroller, wherein the program storage medium tangibly embodies a program of instructions executable by the microcontroller to calibrate the main current shunt circuit.

8. The PAFCI as in claim 1, wherein the processor circuit comprises a microcontroller, wherein the microcontroller comprises:
   a non-transitory program storage medium readable by the microcontroller, wherein the program storage medium tangibly embodies a program of instructions executable by the microcontroller to determine an inrush/power-on arc condition or a steady state arc condition.

9. The PAFCI as in claim 1, wherein the processor circuit comprises a microcontroller, wherein the microcontroller comprises:
    a non-transitory program storage medium readable by the microcontroller, wherein the program storage medium tangibly embodies a program of instructions executable by the microcontroller to determine:
        $CLV_{inst}$=instantaneous Current leads voltage in units of samples;
        $FSW_{inst}$=Instantaneous Flat Spot Width in units of samples;
        $CLV_{flt}$=low Pass Filtered $CLV_{inst}$ in units of samples;
        $FSW_{flt}$=Low Pass Filtered $FSW_{inst}$ in units of samples;
        $CLV'_{flt}$=low Pass Filtered $CLV_{inst}$ Variance;
        $FSW'_{flt}$=low Pass Filtered FSW Variance;
        $CLV''_{flt}$=$CLV'_{inst}$−$CLV'_{flt}$; and
        $FSW''_{flt}$=Low Pass Filtered Derivative of FSW Variance.

10. The PAFCI as in claim 9, wherein the processor circuit comprises the microcontroller, wherein determining the inrush/power-on arc condition further comprises the non-transitory program storage medium readable by the microcontroller, wherein the program storage medium tangibly embodies the program of instructions executable by the microcontroller to determine the inrush/power-on arcing condition, wherein the instructions include:
    incrementing a first event counter if $CL_{fl\ pk}$ is less than a predetermined maximum and $CLV_{flt}$ is greater than a predetermined first inrush sample quantity and if $FSW'_{flt}$ is less than a predetermined second inrush sample quantity; and
    triggering the trigger circuit if the first event counter exceeds a predetermined event count.

11. The PAFCI as in claim 9, wherein the processor circuit comprises the microcontroller, wherein determining the inrush/power-on arc condition further comprises the non-transitory program storage medium readable by the microcontroller, wherein the program storage medium tangibly embodies the program of instructions executable by the microcontroller to determine the steady state (SS) arcing condition, wherein the instructions include:
    incrementing a second event counter:
        if $CLV_{flt}$>SS1 AND SS2>$FSW''_{flt}$>SS3 AND SS4>$CLV''_{flt}$>SS5; or
        if $CLV_{flt}$>SS1 AND SS2>$FSW''_{flt}$>SS6 AND SS7>$CLV''_{flt}$>SS3 AND T>$T_1$ sec; or
        if $CLV_{flt}$>SS8 AND $FSW_{flt}$>SS9 AND $FSW''_{flt}$>SS10 AND $CLV''_{flt}$>SS11 AND T>$T_1$ sec;
    where SS1, SS2, SS3, SS4, SS5, SS6, SS7, SS8, SS9, SS10, SS11=steady state arcing parameters; and
    triggering the trigger circuit if the second event counter exceeds a predetermined event count.

12. A programmable Arc Fault Circuit Interrupter (PAFCI) for classifying arcing parameters according to a connected load and detecting parallel or series arcing in accordance with the arcing parameters, the PAFCI comprising:
    a sensing circuit;
    a processor circuit connectable to the sensing circuit, wherein the processor circuit comprises:
        a microcontroller, wherein the microcontroller comprises:
            a non-transitory program storage medium readable by the microcontroller, wherein the program storage medium tangibly embodies a first program of instructions executable by the microcontroller to classify the arcing parameters according to the connected load;
            a non-transitory program storage medium readable by the microcontroller, wherein the program storage medium tangibly embodies a second program of instructions executable by the microcontroller to determine a parallel arcing condition;
            the non-transitory program storage medium readable by the microcontroller, wherein the program storage medium tangibly embodies a third program of instructions executable by the microcontroller to determine a series arcing condition; and
    wherein the PAFCI does not include toroidal devices for sensing series or parallel arcing conditions.

13. The PAFCI as in claim 12 further comprising a non-transitory program storage medium readable by the microcontroller, wherein the program storage medium tangibly embodies a program of instructions executable by the microcontroller to determine $CLV_{inst}$=instantaneous Current leads voltage.

14. The PAFCI as in claim 12 wherein the sensing circuit comprises:
    a main current shunt analog-digital-converter (ADC) circuit, wherein the main current shunt ADC circuit determines a first circuit parameter (AIN_I);
    a small current shunt ADC circuit, wherein the small current shunt ADC circuit determines a second circuit parameter (AIN_I2); and
    wherein the first and second circuit parameters are processed by the microcontroller to determine a parallel arcing condition.

15. The PAFCI as in claim 12 wherein the at least one sensing circuit comprises:
    a voltage sense circuit, wherein the voltage sense circuit determines a third circuit parameter (AIN_V); and
    a voltage zero crossing detection circuit (ZCD), wherein the voltage ZCD determines a fourth circuit parameter (AIN_ZCD).

16. A method for detecting arc faults based upon connected load dependent arcing threshold parameters, the method comprising:
    classifying the dependent arcing threshold parameters according to the connected load and wherein classifying the dependent arcing threshold parameters according to the connected load further comprises:
        determining the following circuit parameters according to the connected load;
            $CLV_{inst}$=instantaneous Current leads voltage in units of samples;
            $FSW_{inst}$=Instantaneous Flat Spot Width in units of samples;
            $CLV_{flt}$=low Pass Filtered $CLV_{inst}$ in units of samples;
            $FSW_{flt}$=Low Pass Filtered $FSW_{inst}$ in units of samples;
            $CLV'_{flt}$=low Pass Filtered $CLV_{inst}$ Variance;
            $FSW'_{flt}$=low Pass Filtered FSW Variance;
            $CLV''_{flt}$=$CLV'_{inst}$−$CLV'_{flt}$; and
            $FSW''_{flt}$=Low Pass Filtered Derivative of FSW Variance; and
        determining if an arcing condition exists based upon the dependent arcing threshold parameters.

17. The method as in claim 16 wherein determining $CLV_{inst}$ further comprises:
    determining a half current cycle associated with the connected load;
    determining the beginning of the $FSW_{inst}$;

determining a voltage zero (ZC) crossing;
determining the end of the $FSW_{inst}$; and
calculating $CLV_{inst}$ from the beginning of the $FSW_{inst}$ to the ZC crossing at the end of the $FSW_{inst}$.

18. The method as in claim 16 wherein determining $CLV_{inst}$ further comprises:
determining a full current cycle associated with the connected load;
determining the beginning of the $FSW_{inst}$;
determining a voltage zero (ZC) crossing before the beginning of the $FSW_{inst}$;
determining the end of the $FSW_{inst}$; and
calculating $CLV_{inst}$ from the beginning of the $FSW_{inst}$ to the ZC crossing at the end of the $FSW_{inst}$.

19. The method as in claim 16 wherein classifying the dependent arcing threshold parameters according to the connected load further comprises:
providing a processor circuit, wherein the processor circuit comprises:
a microcontroller, wherein the microcontroller comprises:
a non-transitory program storage medium readable by the microcontroller, wherein the program storage medium tangibly embodies a first program of instructions executable by the microcontroller to classify the arcing parameters according to the connected load.

\* \* \* \* \*